United States Patent
Tada et al.

(10) Patent No.: US 12,250,885 B2
(45) Date of Patent: Mar. 11, 2025

(54) THERMOELECTRIC CONVERSION ELEMENT, METHOD FOR MANUFACTURING THE SAME, AND THERMOELECTRIC CONVERSION DEVICE

(71) Applicants: Mitsuba Corporation, Kiryu (JP); National Institute for Materials Science, Ibaraki (JP)

(72) Inventors: Satoki Tada, Kiryu (JP); Yukihiro Isoda, Tsukuba (JP)

(73) Assignees: Mitsuba Corporation, Gunma (JP); National Institute for Materials Science, Ibaraki (JP)

(*) Notice: Subject to any disclaimer, the term of this patent is extended or adjusted under 35 U.S.C. 154(b) by 0 days.

(21) Appl. No.: 17/769,352

(22) PCT Filed: Sep. 11, 2020

(86) PCT No.: PCT/JP2020/034386
§ 371 (c)(1),
(2) Date: Apr. 15, 2022

(87) PCT Pub. No.: WO2021/079644
PCT Pub. Date: Apr. 29, 2021

(65) Prior Publication Data
US 2024/0147859 A1    May 2, 2024

(30) Foreign Application Priority Data
Oct. 25, 2019  (JP) ................... 2019-194228

(51) Int. Cl.
*H10N 10/853*   (2023.01)
*C22C 21/02*    (2006.01)
(Continued)

(52) U.S. Cl.
CPC .......... *H10N 10/853* (2023.02); *C22C 21/02* (2013.01); *C22C 21/08* (2013.01); *H10N 10/01* (2023.02);
(Continued)

(58) Field of Classification Search
CPC ...... H10N 10/853; H10N 10/17; H10N 10/01; H10N 10/817
See application file for complete search history.

(56) References Cited

U.S. PATENT DOCUMENTS

| | | |
|---|---|---|
| 2013/0152990 A1 | 6/2013 | Lai et al. |
| 2014/0299170 A1 | 10/2014 | Simonin et al. |

(Continued)

FOREIGN PATENT DOCUMENTS

| | | |
|---|---|---|
| CN | 103219456 A | 7/2013 |
| CN | 104362249 A | 2/2015 |

(Continued)

OTHER PUBLICATIONS

Fujiwara et al, JP 2017107925 A, English Machine Translation. (Year: 2017).*

(Continued)

*Primary Examiner* — Tae-Sik Kang
(74) *Attorney, Agent, or Firm* — Wood Herron & Evans LLP (57) ABSTRACT

A thermoelectric conversion element (100) of the present invention includes a first electrode (105) which has one side joined to a first surface (101*a*) of an n-type semiconductor via an n-side junction layer (102), and the other side joined to a first surface (103*a*) of a p-type semiconductor via a p-side junction layer (104), and a second electrode (106) which is joined to each of a second surface (101*b*) of the n-type semiconductor and a second surface (103*b*) of the p-type semiconductor via the n-side junction layer (102) and (Continued)

the p-side junction layer (104). Each of the n-type semiconductor (101) and the p-type semiconductor (103) has a composition represented by Formulas (1) and (2) below, and the n-side junction layer (102) and the p-side junction layer (104) include Al.

$$Mg_2Si_aSn_{1-a}+A \qquad (1)$$

$$Mg_mSi_xSn_yGe_z+B \qquad (2).$$

10 Claims, 8 Drawing Sheets

(51) Int. Cl.
*C22C 21/08* (2006.01)
*H10N 10/01* (2023.01)
*H10N 10/17* (2023.01)
*H10N 10/817* (2023.01)
*H10N 10/851* (2023.01)

(52) U.S. Cl.
CPC .......... *H10N 10/17* (2023.02); *H10N 10/817* (2023.02); *H10N 10/8556* (2023.02)

(56) References Cited

U.S. PATENT DOCUMENTS

| | | | |
|---|---|---|---|
| 2016/0380175 A1 | 12/2016 | Miner et al. | |
| 2018/0033938 A1 | 2/2018 | Lee et al. | |
| 2018/0342659 A1 | 11/2018 | Taylor et al. | |
| 2019/0051808 A1 | 2/2019 | Larsson et al. | |

FOREIGN PATENT DOCUMENTS

| | | | | |
|---|---|---|---|---|
| EP | 3428980 A1 | | 1/2019 | |
| JP | 2002094131 A | | 3/2002 | |
| JP | 2006049736 A | | 2/2006 | |
| JP | 2007146283 A | | 6/2007 | |
| JP | 2009188368 A | | 8/2009 | |
| JP | 2010037641 A | | 2/2010 | |
| JP | 2014204093 A | | 10/2014 | |
| JP | 2015026672 A | | 2/2015 | |
| JP | 2015050272 A | | 3/2015 | |
| JP | 2015050273 A | | 3/2015 | |
| JP | 5931657 B2 | | 6/2016 | |
| JP | 2017107925 A | * | 6/2017 | |
| JP | 6160740 B2 | | 7/2017 | |
| JP | 2017152691 A | | 8/2017 | |
| JP | 2017175122 A | | 9/2017 | |
| JP | 2018152499 A | | 9/2018 | |
| JP | 2018160560 A | | 10/2018 | |
| JP | 2018174211 A | | 11/2018 | |
| KR | 20140011668 A | | 1/2014 | |
| KR | 101825302 B1 | | 2/2018 | |
| WO | WO-2016052272 A1 | * | 4/2016 | ................ B22F 3/14 |
| WO | 2017098863 A1 | | 6/2017 | |
| WO | WO-2018066657 A1 | * | 4/2018 | ............. C01B 33/06 |

OTHER PUBLICATIONS

Tada et al, WO 2018066657 A1, English Machine Translation. (Year: 2018).*

Tada et al, WO 2016052272 A1, English Machine Translation. (Year: 2016).*

European Patent Office, Office Action issued in EP 20878073.4 dated Sep. 21, 2023.

Japanese Patent Office, Notice of Allowance issued in JP 2021-554147 dated May 14, 2024.

PCT Office, International Search Report issued in PCT/JP2020/034386 mailed on Dec. 1, 2020.

Japanese Patent Office, Office Action issued in App. No. 2021-554147, Mailed on Dec. 5, 2023, (with English Translation) pp. 10.

* cited by examiner

THERMOELECTRIC CONVERSION ELEMENT, METHOD FOR MANUFACTURING THE SAME, AND THERMOELECTRIC CONVERSION DEVICE

TECHNICAL FIELD

The present invention relates to a thermoelectric conversion element, a method for manufacturing the same, and a thermoelectric conversion device.

Priority is claimed on Japanese Patent Application No. 2019-194228, filed Oct. 25, 2019, the content of which is incorporated herein by reference.

BACKGROUND ART

In order to realize an energy-saving society as a measure against global warming, research and development that effectively utilizes waste heat at 200 to 400° C. discharged from automobiles and factories has increased. Thermoelectric conversion is a technique for performing a direct conversion from thermal energy to electrical energy using the Seebeck effect, or a direct conversion from electrical energy to thermal energy using the Peltier effect. For example, when a temperature difference is applied to a thermoelectric element, a thermoelectromotive force due to the Seebeck effect can be generated. Therefore, thermoelectric conversion is receiving attention as a technique that enables power generation from waste heat. As a thermoelectric material used in a medium temperature range, $Mg_2SiSn$, which does not contain rare metals or toxic elements, is receiving attention, and thermoelectric conversion devices using $Mg_2SiSn$ have been developed.

Aluminum-based materials are used to join the thermoelectric materials that make up a thermoelectric conversion device and the electrodes. An advantage of using an aluminum-based material is that a junction temperature is lower than that of other junction materials (Ag-based materials, Ti-based materials, and Ni-based materials). Patent Literature 1 discloses a technique of forming a Ti layer between an aluminum brazing metal as a junction material and an electrode, and junction a thermoelectric material and the electrode. Patent Literatures 2 to 4 disclose a technique for forming a compound made of Al and Ni, or a compound layer of an element forming a thermoelectric element and Al on a junction interface between an $Mg_2Si$-based, Si—Ge-based or MnSi-based silicide thermoelectric material with a composition including Si and the electrode, and junction the thermoelectric element to the electrode. Patent Literature 5 discloses a technique for forming a layer including $Al_3Ni_2$ and $Al_3Ni$ at the junction interface between a Ni layer as a junction material and a Ni electrode.

CITATION LIST

Patent Literature

[Patent Literature 1]
Japanese Unexamined Patent Application, First Publication No. 2006-49736
[Patent Literature 2]
Japanese Patent No. 5913657
[Patent Literature 3]
Japanese Patent No. 6160740
[Patent Literature 4]
Japanese Unexamined Patent Application, First Publication No. 2018-160560

[Patent Literature 5]
Japanese Unexamined Patent Application, First Publication No. 2018-152499

SUMMARY OF INVENTION

Technical Problem

Junction of $Mg_2SiSn$ and an electrode is an important technique for manufacturing high-power devices using $Mg_2SiSn$. An upper limit temperature for using $Mg_2SiSn$ is 400° C., and a joint capable of withstanding this temperature is required. Brazing in a furnace is considered to be the most suitable junction method, but the brazing temperature is generally a high temperature of around 700° C. Active silver wax is often used for electrode junction of $Mg_2SiSn$, but in this case there may be a problem in that cracks and voids are generated at the junction interface due to a high junction temperature and the diffusion of silver. Due to such circumstances, it is difficult to put into practical use and commercialize a thermoelectric conversion device that uses a medium temperature range of 200 to 400° C. as a heat source.

The present invention has been made in view of the above circumstances, and an object of the present invention is to provide a thermoelectric conversion element capable of obtaining a high output with high reliability, a method for manufacturing the same, and a thermoelectric conversion device.

Solution to Problem

In order to solve the above problems, the present invention adopts the following means.

(1) A thermoelectric conversion element according to an aspect of the present invention includes an n-type semiconductor, a p-type semiconductor, an n-side junction layer formed on each of a first surface and a second surface of the n-type semiconductor, a p-side junction layer formed on each of a first surface and a second surface of the p-type semiconductor, a first electrode which has one side joined to the first surface of the n-type semiconductor via the n-side junction layer, and the other side joined to the first surface of the p-type semiconductor via the p-side junction layer, and a second electrode which is joined to each of the second surface of the n-type semiconductor and the second surface of the p-type semiconductor via the n-side junction layer and the p-side junction layer, in which the n-type semiconductor has a composition represented by the following Formula (1), the p-type semiconductor has a composition represented by the following Formula (2), and the n-side junction layer and the p-side junction layer include Al:

$$Mg_2Si_aSn_{1-a}+A \qquad (1)$$

(provided that $0.25 \leq a < 0.75$, and A includes at least one of Sb, Bi, and Fe).

$$Mg_mSi_xSn_yGe_z+B \qquad (2)$$

(provided that $1.98 \leq m \leq 2.01$, $0 < x \leq 0.25$, $0.60 \leq y \leq 0.95$, $z \geq 0$, $x+y+z=1$, and $-1.00x+0.40 \geq z \geq -2.00x+0.10$ ($0.00 < x \leq 0.25$), $-1.00y+1.00 \geq z \geq -1.00y+0.75$ ($0.60 \leq y \leq 0.90$), $-2.00y+1.90 \geq z \geq -1.00y+0.75$ ($0.90 < y \leq 0.95$), and B includes at least one of Group 1A alkali metals, Au, Ag, Cu, Zn, Ca, and Ga).

(2) In the thermoelectric conversion element according to (1), it is preferable that Sn be included in at least one of the n-side junction layer and the p-side junction layer.
(3) In the thermoelectric conversion element according to (1) or (2), it is preferable that the p-side junction layer have a first p-side alloy layer including at least one of constituent materials of the first electrode and Al on the first electrode side, and a second p-side alloy layer including at least one of constituent materials of the second electrode and Al on the second electrode side.
(4) In the thermoelectric conversion element according to any one of (1) to (3), it is preferable that the n-side junction layer have a first n-side alloy layer including at least one of the constituent materials of the first electrode and Al on the first electrode side, and have a second n-side alloy layer including at least one of the constituent materials of the second electrode and Al on the second electrode side.
(5) In the thermoelectric conversion element according to any one of (1) to (4), it is preferable that the first electrode and the second electrode include Ni as a main component, the n-side junction layer have an AlNi layer and an $Al_3Ni_2$ layer in this order from the first electrode side or the second electrode side, and the p-side junction layer have a $Ni_3Sn_2$ layer, an AlNi layer, and an $Al_3Ni_2$ layer in this order from the first electrode side or the second electrode side.
(6) In the thermoelectric conversion element according to any one of (1) to (5), it is preferable that a content of Si in the n-side junction layer and the p-side junction layer be 2 wt % or more and 15 wt % or less.
(7) According to an aspect of the present invention, a thermoelectric conversion device is provided in which a plurality of thermoelectric conversion elements according to any one of (1) to (6) are connected, two adjacent thermoelectric conversion elements share the second electrode, and among the two adjacent thermoelectric conversion elements, the n-side junction layer constituting one thermoelectric conversion element and the p-side junction layer constituting the other thermoelectric conversion element are connected with the shared second electrode interposed therebetween.
(8) According to an aspect of the present invention, a method for manufacturing the thermoelectric conversion element according to any one of (1) to (6) is provided, the method including a stacked body-forming process of forming a stacked body; a pressing process of pressing the stacked body from both sides in a stacking direction; and a heating process of heating the pressed stacked body, in which the stacked body is formed by disposing a first n-side junction layer and a second n-side junction layer on each of the first surface and the second surface of the n-type semiconductor, by disposing a first A-side junction layer and a second p-side junction layer on each of the first surface and the second surface of the p-type semiconductor, by disposing a first electrode on the first n-side junction layer and the first p-side junction layer to straddle both the junction layers, and by disposing one and the other of the two second electrodes on each of the second n-side junction layer and the second p-side junction layer, and in which the heating process, a heating temperature is set to 550° C. or more and 640° C. or less, and a heating time is set to 1 minute or longer and 60 minutes or shorter.
(9) In the method for manufacturing the thermoelectric conversion element according to (8), it is preferable that a rate of temperature decrease of the stacked body after the heating process be set to 2° C./min or more and 500° C./min or less.
(10) In the method for manufacturing the thermoelectric conversion element according to (8) or (9), it is preferable that a rate of temperature increase of the stacked body before the heating process be set to 5° C./min or more and 200° C./min or less.
(11) In the method for manufacturing a thermoelectric conversion element according to any one of (8) to (10), it is preferable that a pressure applied to the stacked body in the pressing process be set to 0.01 kg/cm² or more and 816 kg/cm² or less.

Advantageous Effects of Invention

According to the present invention, it is possible to provide a thermoelectric conversion element, a method for manufacturing the same, and a thermoelectric conversion device capable of obtaining a high output with high reliability.

DESCRIPTION OF EMBODIMENTS

Hereinafter, the present invention will be described in detail with reference to the drawings as appropriate. In the drawings used in the following description, the characteristic parts may be shown to be enlarged for convenience to make the features of the present invention easy to understand, and the dimensional ratios of each constituent element may differ from the actual ones. Although materials, dimensions, and the like exemplified in the following description are examples, the present invention is not limited thereto, and can be appropriately modified and carried out within the range in which the effects of the present invention are exhibited.

Figure 1:
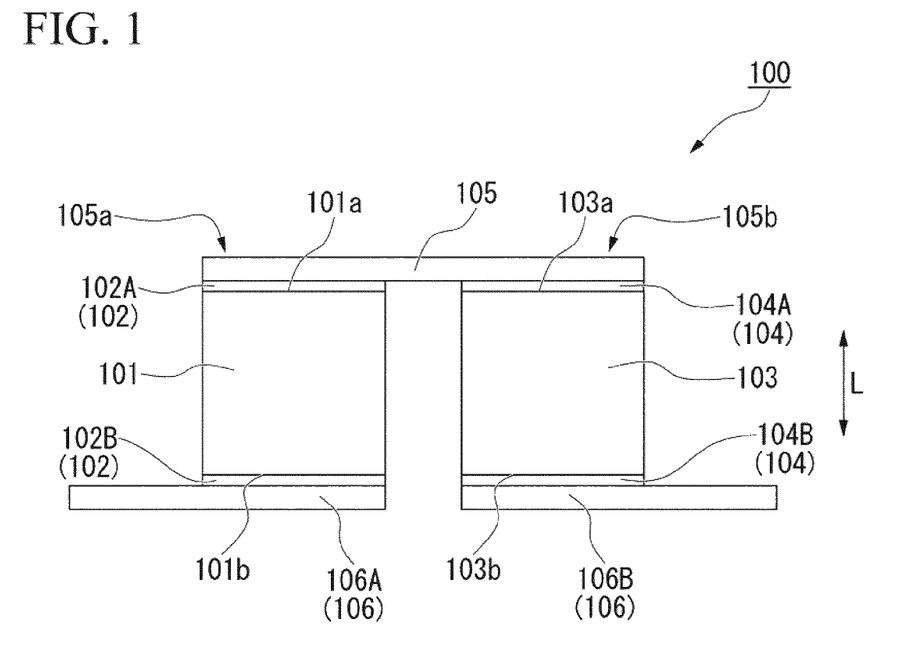
FIG. 1 is a plan view of a thermoelectric conversion element according to an embodiment of the present invention.

FIG. 1 is a plan view schematically showing the configuration of a π-type thermoelectric conversion element 100 according to an embodiment of the present invention. The thermoelectric conversion element 100 is mainly equipped with an n-type semiconductor 101, two n-side junction layers 102, a p-type semiconductor 103, two p-side junction layers 104, a first electrode 105, and two second electrodes 106. The n-type semiconductor 101 is joined to the first electrode 105 and the second electrode 106 via the n-side junction layer 102, and the p-type semiconductor 103 is joined to the first electrode 105 and the second electrode 106 via the p-side junction layer 104. (Hereinafter, the n-type semiconductor 101, the n-side junction layer 102, the p-type semiconductor 103, the p-side junction layer 104, the first electrode 105, and the second electrode 106 may be referred to as a semiconductor 101, a junction layer 102, a semiconductor 103, a junction layer 104, an electrode 105, and an electrode 106, respectively.)

The n-type semiconductor 101 has a composition represented by the following formula (1).

$$Mg_2Si_aSn_{1-a}+A \qquad (1)$$

provided that 0.25≤a<0.75, and A includes at least one of Sb, Bi, and Fe.

The p-type semiconductor 103 has a composition represented by the following formula (2):

$$Mg_mSi_xSn_yGe_z+B \qquad (2)$$

(provided that 1.98≤m≤2.01, 0<x≤0.25, 0.60≤y≤0.95, z≥0, x+y+z=1, and −1.00x+0.40≥z≥−2.00x+0.10 (0.00<x≤0.25), −1.00y+1.00≥z≥−1.00y+0.75 (0.60≤y≤0.90), −2.00y+1.90≥z≥−1.00y+0.75 (0.90<y≤0.95), and B includes at least one of Group 1A alkali metals, Au, Ag, Cu, Zn, Ca, and Ga.

The n-side junction layer 102 is formed on one main surface (a first surface) 101a and another main surface a (second surface) 101b of the surfaces of the n-type semiconductor 101. The p-side junction layer 103 is formed on one main surface (a first surface) 103a and another main surface (a second surface) 103b of the surfaces of the p-type semiconductor 103. Thicknesses of the n-side junction layer 102 and the p-side junction layer 104 are preferably 5 μm or more and 500 μm or less, and more preferably about 80 μm.

As the materials of the n-side junction layer 102 and the p-side junction layer 104, for example, Al (aluminum), Ag (silver), Ti (titanium), Ni (nickel), alloys including 80 wt % or more thereof (Al wax, silver wax, titanium wax, and nickel wax) and the like are adopted. Among these, an Al wax having a low junction temperature is particularly preferable. Examples of composition materials of Al waxes other than Al include Si, Fe, Mg, Cu, Mn, Cr, Zn, Ti, Bi and the like. When the Al wax is formed of Al, Si, and Fe, the compositional proportion of the Al wax can be, for example, Al: 87.2 wt %, Si: 12 wt %, and Fe: 0.8 wt %.

A heating temperature (a junction temperature) for junction the n-type semiconductor 101 to the first electrode 105 and the second electrode 106 is proportional to a Si content in the n-side junction layer 102. Similarly, the heating temperature for junction the p-type semiconductor 103 to the first electrode 105 and the second electrode 106 is proportional to the Si content in the p-side junction layer 104. Therefore, a suitable junction temperature can be realized by adjusting the Si content. Specifically, if the Si content ratio is 11 wt % or more and 13 wt % or less, because the junction temperature can be set to about 550° C. to 640° C., high reliability is obtained, and it is possible to realize a joined state in which a high output can be obtained when a device operates.

The n-side junction layer 102 may have a first n-side alloy layer (not shown) including at least one of the constituent materials of the first electrode 105 and Al in the vicinity of an interface on the first electrode 105 side. Similarly, the n-side junction layer 102 may have a second n-side alloy layer (not shown) including at least one of the constituent material of the second electrode and Al in the vicinity of the interface on the second electrode side (see examples to be described below).

When there are a first n-side alloy layer and a second n-side alloy layer, because a change in composition in a stacking direction is gradual, it is thought that the effect of stress relaxation can be obtained, the problem of peeling of the first electrode 105 and the second electrode 106 can be prevented, and reliability can be enhanced.

The p-side junction layer 104 may have a first p-side alloy layer (not shown) including at least one of the constituent material of the first electrode 105 and Al in the vicinity of the interface on the first electrode 105 side. Similarly, the p-side junction layer 104 may have a second p-side alloy layer (not shown) including at least one of the constituent material of the second electrode 106 and Al in the vicinity of the interface on the second electrode 106 side (see examples to be described below). When there are a first p-side alloy layer and a second p-side alloy layer, because the change in composition in the stacking direction becomes gradual, it is considered that the effect of stress relaxation can be obtained, the problem of peeling of the first electrode 105 and the second electrode 106 can be prevented, and reliability can be improved.

As an example, when the first electrode 105 and the second electrode 106 contain Ni as a main component, Ni is distributed to exude near the interface between the n-side junction layer 102 and the p-side junction layer 104 which are in contact with them. Then, an alloy layer of Ni and Al is formed. In this case, the n-side junction layer 102 has an AlNi layer and an $Al_3Ni_2$ layer in this order from the first electrode 105 side or the second electrode 106 side (junction interface). Further, the p-side junction layer 104 has a $Ni_3Sn_2$ layer, an AlNi layer, and an $Al_3Ni_2$ layer in this order from the first electrode 105 side or the second electrode 106 side (junction interface).

It is preferable that Sn (tin) be included in at least one of the n-side junction layer 102 and the p-side junction layer 104. When Sn is included, occurrence of cracks and the like is suppressed, and the joined state between the semiconductors 102 and 103 and the electrodes 105 and 106 can be improved. In the state in which Sn is included, this may be achieved, for example, by some of the Sn constituting the semiconductors 102 and 103 being activated and freed in the heating process, penetrating the junction layers 102 and 104, and eventually segregating into the alloy layer near the interface of the electrodes 105 and 106. (The method for segregating Sn may not follow this process.) Actually, because a inching point of the p-type semiconductor 103 is lower than that of the n-type semiconductor 101, and Sn tends to be free, Sn is segregated with respect to the p-side junction layer 104 with a higher frequency than that of the n-side junction layer 102.

The shapes of the first electrode 105 and the two second electrodes 106 (106A, 106B) are not limited, but are preferably flat. In the first electrode 105, one side 105a (here, a left side) is joined to the first surface 101a of the n-type semiconductor via the n-side junction layer 102, and another side 105b (here, a right side) is joined to the first surface 103a of the p-type semiconductor via the p-side junction layer 104. One side (here, the right side) of one second electrode 106A is joined to the second surface 101b of the n-type semiconductor via the n-side junction layer 102, and one side (here, the left side) of another second electrode 106B is joined to the second surface 103b of the p-type semiconductor via the p-side junction layer 104.

Examples of the materials of the first electrode 105 and the second electrode 106 include Ni, Cu, Ti, Fe, Au, Ag, Al and the like. However, in the manufacturing process of the thermoelectric conversion element, because there is a need for heating at a high temperature of 500° C. or more, Ni, which has high heat resistance, is preferable.

Figure 2:
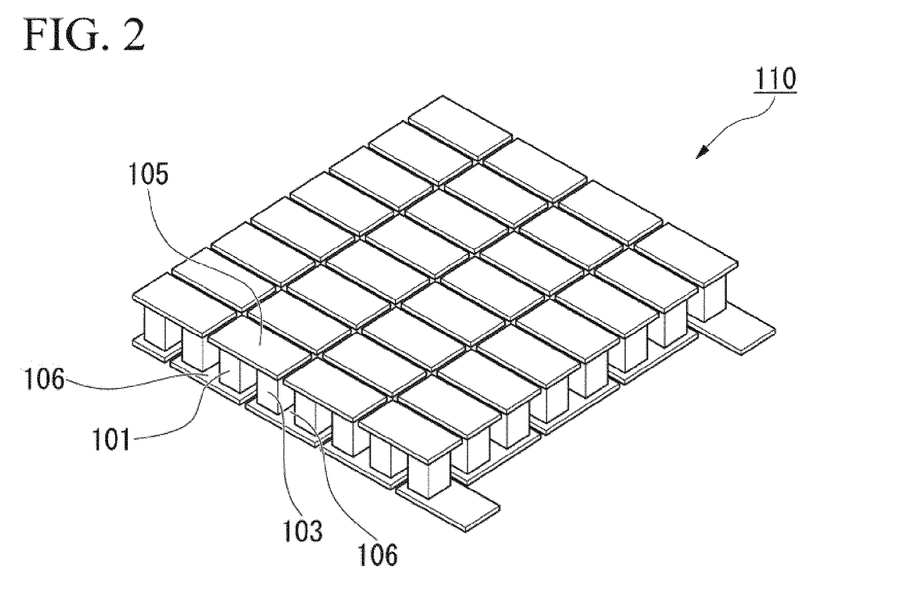
FIG. 2 is a perspective view of a thermoelectric conversion device in which a plurality of thermoelectric conversion elements of FIG. 1 are connected.

FIG. 2 is a perspective view of a thermoelectric conversion device 110 in which a plurality of thermoelectric conversion elements 100 are connected. Two adjacent thermoelectric conversion elements 100 share a second electrode 106. Among the two adjacent thermoelectric conversion elements 100, the n-side junction layer 101 constituting one thermoelectric conversion element and the p-side junction layer 103 constituting the other thermoelectric conversion element are connected with the shared second electrode 106 interposed between them.

The thermoelectric conversion element 100 of this embodiment can be manufactured mainly via the following procedure.

First, the n-type semiconductor 101, the n-side junction layer 102, the p-type semiconductor 103, the p-side junction layer 104, the first electrode 105, and the second electrode 106 are stacked (assembled) to be aligned with the stacking order of the thermoelectric conversion element 100 in the completed state to form a stacked body (stacked body-forming process).

Specifically, a first n-side junction layer 102A and a second n-side junction layer 102B are disposed on the first surface 101a and the second surface 101b of the n-type semiconductor 101, respectively. Similarly, a first p-side junction layer 104A and a second p-side junction layer 104B are disposed on the first surface 103a and the second surface 103b of the p-type semiconductor 103, respectively.

In addition, the first electrode 105 is disposed to straddle both the junction layers with respect to the first n-side junction layer 102A and the first p-side junction layer 104A. That is, the first electrode 105 is disposed so that one side is in contact with the first n-side junction layer 102A and the other side is in contact with the first p-side junction layer 104A.

Further, one (here, the left side) second electrode 106A and the other (here, the right side) second electrode 106B among the two second electrodes 106 are disposed with respect to the second n-side junction layer 102B and the second p-side junction layer 104B, respectively. That is, one second electrode 106A is disposed so that one side is in contact with the second n-side junction layer 102B, and the other second electrode 106B is disposed so that one side is in contact with the second p-side junction layer 104B.

Next, in order to fix the arrangement of each layer with respect to the formed stacked body, pressure is applied (pressed) from both sides in the stacking direction L (pressing process). The pressure applied to the stacked body is preferably 0.01 kg/cm$^2$ or more and 816 kg/cm$^2$ or less.

Finally, the thermoelectric conversion element 100 of the present embodiment can be obtained by accommodating and heating the pressed stacked body in a vacuum furnace (heating process). The heating temperature (junction temperature) is preferably 550° C. or more and 570° C. or less, and the heating time (junction time) is preferably 1 minute or longer and 19 minutes or shorter. A temperature rise rate of the stacked body before the heating process is preferably 5° C./min or more and 200° C./min or less, and a temperature drop rate of the stacked body after the heating process is preferably 2° C./min or more and 500° C./min or less.

When forming the thermoelectric conversion device 110, in the stacked body-forming process, the pressing process and the heating process are performed after assembling so that each layer is disposed similarly to that in the thermoelectric conversion device 110.

As described above, in the thermoelectric conversion element according to the present embodiment, both the n-type semiconductor and the p-type semiconductor are formed of $Mg_2SiSn$-based thermoelectric materials, and both semiconductors have substantially the same coefficient of linear expansion. Therefore, the difference in the coefficient of linear expansion in a high-temperature state in the manufacturing process can be suppressed to a small level, damage to the junction portion with the electrode can be prevented, and reliability can be improved.

Further, in the thermoelectric conversion element according to the present embodiment, an aluminum-based material having a low junction temperature is used as the junction material. Therefore, it is possible to manufacture a thermoelectric conversion element at a temperature corresponding to the melting point (845° C.) and the usage temperature (400° C.) of $Mg_2SiSn$ constituting the n-type semiconductor and the p-type semiconductor, and it is possible to realize an optimum joined state in which damage such as cracks due to heat is suppressed. As a result, a high output can be obtained when operated as a device.

EXAMPLES

Hereinafter, the effects of the present invention will be made clearer by the examples. The present invention is not limited to the following examples, and can be appropriately modified and implemented without changing the gist thereof.

Example 1

The thermoelectric conversion element was manufactured according to the above-mentioned procedure. The materials and compositions of each semiconductor and each layer were as follows.

N-type semiconductor: $Mg_2Si_{0.5}Sn_{0.5}$+Sb10000 ppm
p-type semiconductor: $Mg_2Si_{0.25}Sn_{0.65}Ge_{0.1}$+Ag20000 ppm+Li5000 ppm
N-side junction layer, and p-side junction layer: Al wax (Al: 87.2 wt %, Si: 12 wt %, and Fe: 0.8 wt %)
First electrode, and second electrode: Ni Further, the dimensions of each constituent element were as follows.

N-type semiconductor, and p-type semiconductor: 4 mm×4 mm×4 mm
N-side junction layer, and p-side junction layer: 4 mm×4 mm×80 μm First electrode, and second electrode: 4 mm×4 mm×1 mm These were stacked, pressed in the stacking direction, and then heated. The heating temperature (junction temperature) was 561° C., the heating time (junction time) was 20 minutes, the temperature rise rate was 10° C./min, and the temperature drop rate was 5° C.

Figure 3:
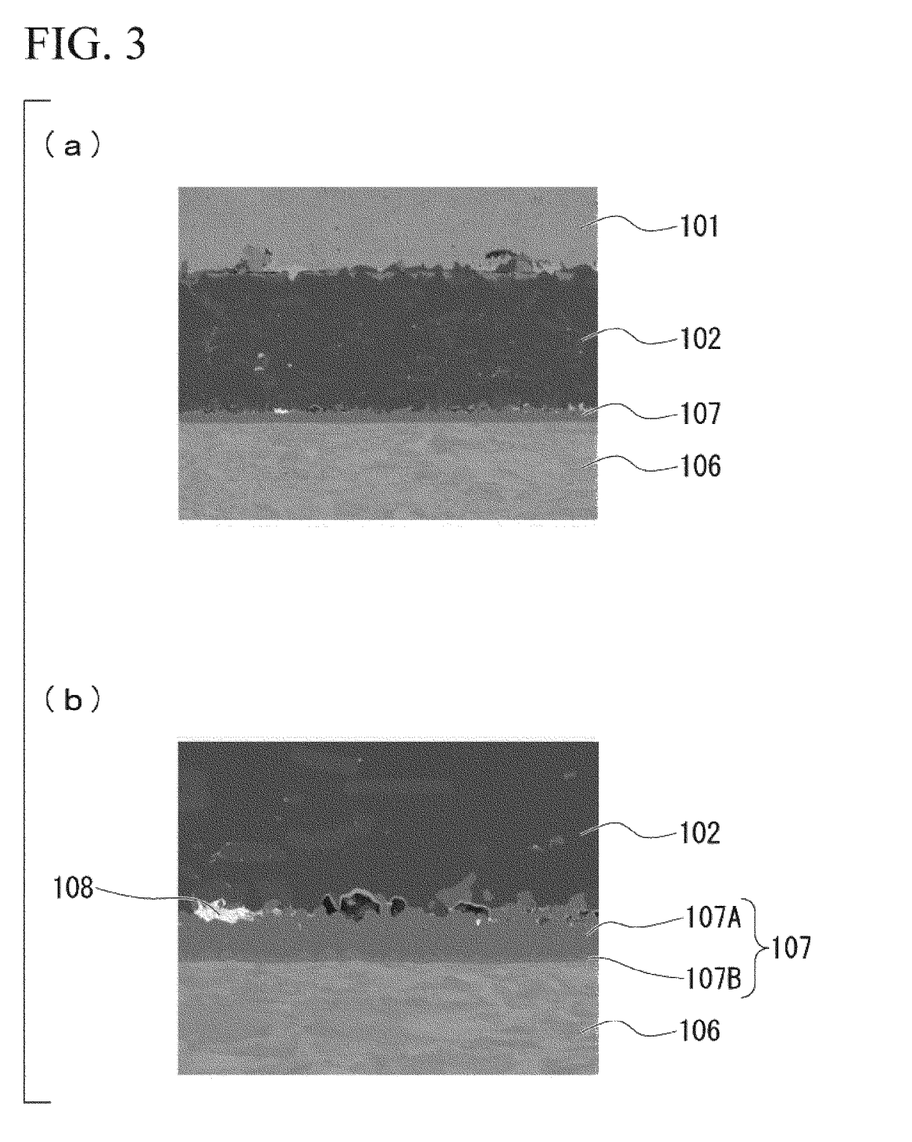
FIG. 3(a) is an SEM image of a junction portion of an n-type semiconductor, a junction layer, and an electrode in the thermoelectric conversion element of Example 1 of the present invention.
FIG. 3(b) is an enlarged view of the vicinity of the junction portion between the junction layer and the electrode in the SEM image of FIG. 1(a).

FIG. 3(a) is an SEM image of the junction portion of the n-type semiconductor 101, the n-side junction layer 102, and the second electrode 106 in the thermoelectric conversion element obtained after the temperature drop. FIG. 3(b) is an enlarged view of the vicinity of the junction portion between the n-side junction layer 102 and the second electrode 106 in the SEM image of FIG. 3(a). It is known from these SEM images that the alloy layer 107 is formed between the n-side junction layer 102 and the second electrode 106. The alloy layer 107 is made of two layers, and as a result of elemental analysis, it is known that the first layer 107A from the n-side junction layer 102 side is formed of $Al_3Ni_2$ and the second layer 107B is formed of AlNi. The thickness of the first layer 107A of the alloy layer is 0.45 to 1.5 µm, and the thickness of the second layer 107B is 6 to 7 µm. A segregated portion 108 of Sn can be seen at a part of the interface between the alloy layer 107 and the n-side junction layer 107.

Figure 4:
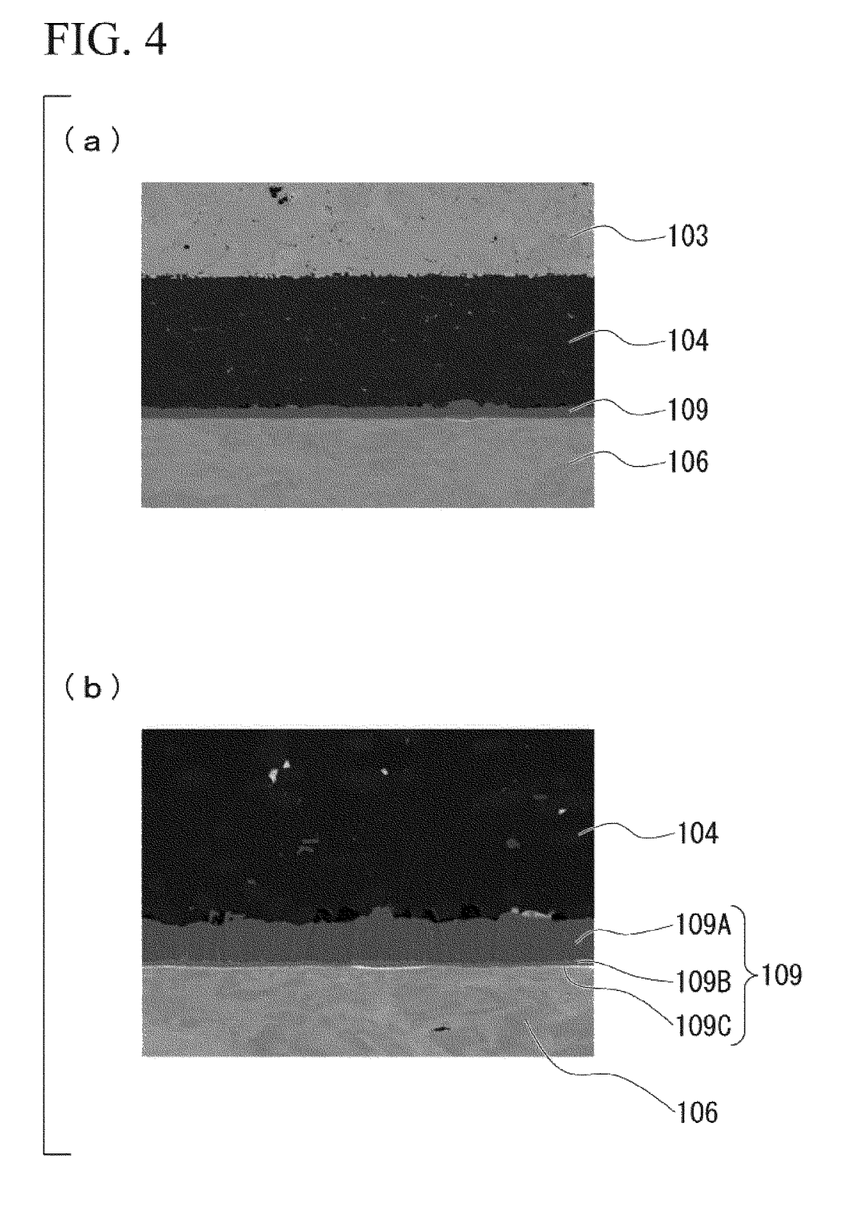
FIG. 4(a) is an SEM image of a junction portion of a p-type semiconductor, a junction layer, and an electrode in the thermoelectric conversion element of the Example 1 of the present invention.
FIG. 4(b) is an enlarged view of the vicinity of the junction portion between the junction layer and the electrode in the SEM image of FIG. 4(a).

FIG. 4(a) is an SEM image of the junction portion of the p-type semiconductor 103, the p-side junction layer 102, and the second electrode 106 in the thermoelectric conversion element obtained after the temperature drop. FIG. 4(b) is an enlarged view of the vicinity of the junction portion between the p-side junction layer 102 and the second electrode 106 in the SEM image of FIG. 4(a). It is known from these SEM images that the alloy layer 109 is formed between the p-side junction layer 102 and the second electrode 106. The alloy layer 109 is formed of three layers, and as a result of elemental analysis, the first layer 109A from the p-type semiconductor 103 side is formed of $Al_3Ni_2$, the second layer 109B is formed of AlNi, and the third layer 109C is formed of $Ni_3Sn_2$. The thickness of the first layer 109A of the alloy layer is 5.4 to 9.4 µm, the thickness of the second layer 109B is 10 to 2.1 µm, and the thickness of the third layer 109C is 0.6 µm.

Figure 5:
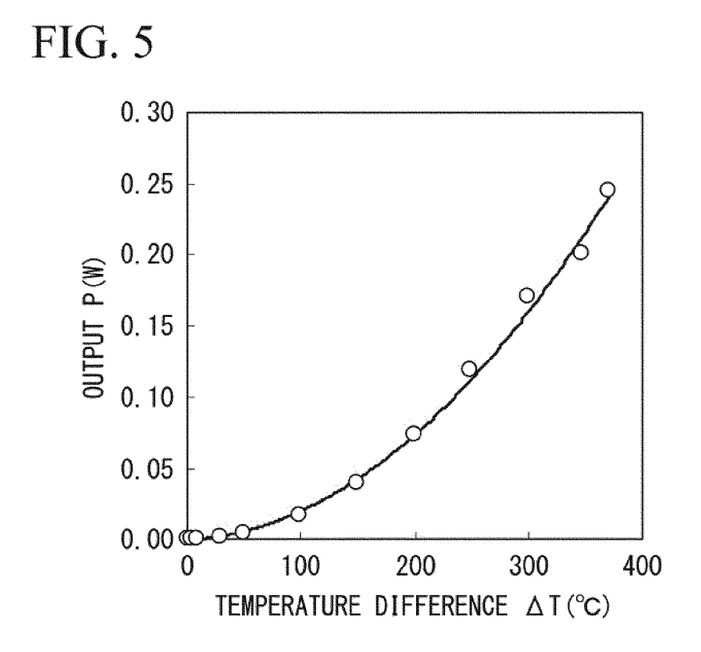
FIG. 5 is a graph showing measurement results of output characteristics obtained by the thermoelectric conversion element of Example 1.

The output characteristics of the obtained thermoelectric conversion element were measured. FIG. 5 is a graph showing the result.

A horizontal axis of the graph shows a temperature difference ΔT (° C.) between the first electrode 105 side and the second electrode 106 side, and a vertical axis of the graph shows an output P (W) generated from the thermoelectric conversion element. The output when the temperature difference is 0.9° C. is 0.91 µW, and the output when the temperature difference is 370.1° C. is 0.24 W. Since the plots of all the measurement results are on almost the same curve, it is known that stable output characteristics are obtained.

Example 2, Comparative Examples 1 and 2

In the heating process, thermoelectric conversion elements were manufactured as Example 2 and Comparative Examples 1 and 2 when the heating time was 20 minutes and the heating temperatures were 561° C., 573° C., and 615° C., respectively. The conditions other than the heating time and the heating temperature were the same as in Example 1.

Figure 6:
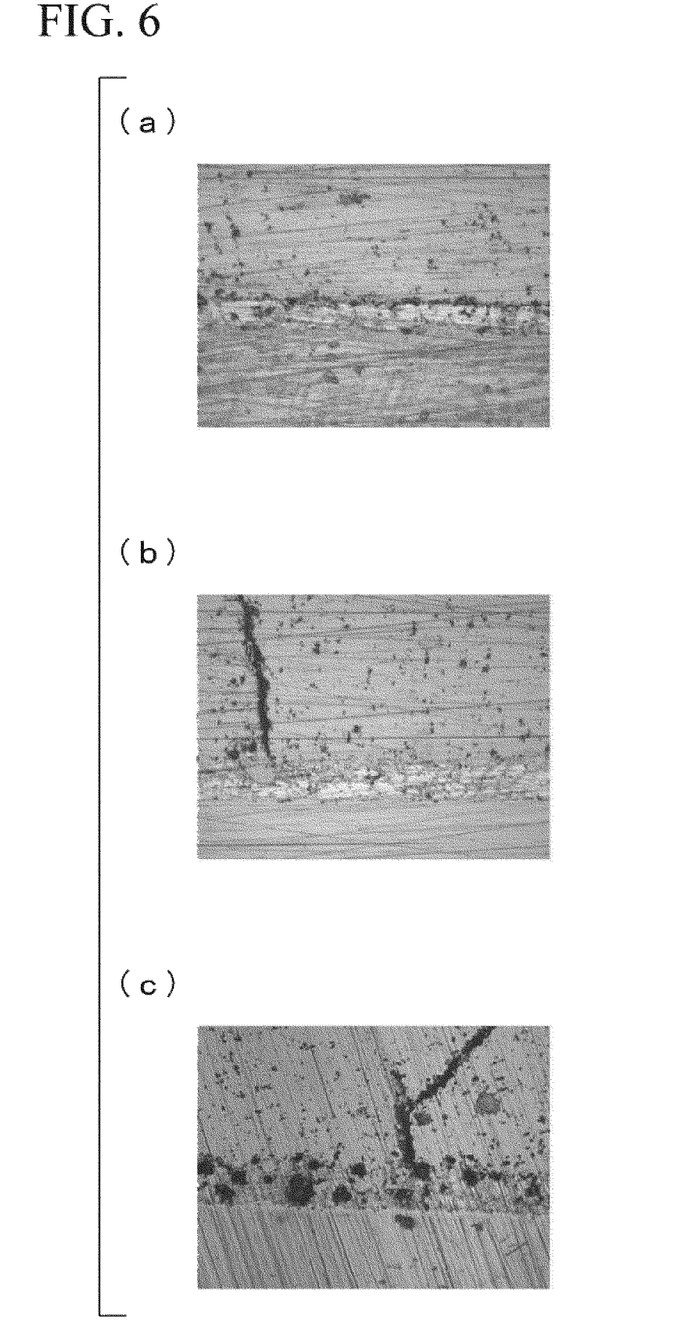
FIGS. 6(a) to 6(c) are photographs of a junction portion of an n-type semiconductor in the thermoelectric conversion elements of Examples 2 and Comparative Examples 1 and 2 of the present invention.

FIGS. 6(a) to 6(c) are photographs of the junction portions of n-type semiconductors in the thermoelectric conversion elements of Examples 2 and Comparative Examples 1 and 2 of the present invention, respectively. When the heating temperatures were 573° C. and 615° C., cracks and voids were generated, and there was a state which was not suitable for the thermoelectric conversion element. However, when the heating temperature was 561° C., a good junction interface was obtained. Although not disclosed here, when the heating temperature was 549° C., the reaction at the interface was insufficient, and the n-type semiconductor and the electrode could not be sufficiently joined.

Example 3, Comparative Examples 3 and 4

In the heating process, when the heating temperature was 573° C. and the heating time was 5 minutes, 10 minutes, and 20 minutes, the thermoelectric conversion element was manufactured as Example 3 and Comparative Examples 3 and 4, respectively. The conditions other than the heating time and the heating temperature were the same as in Example 1.

Figure 7:
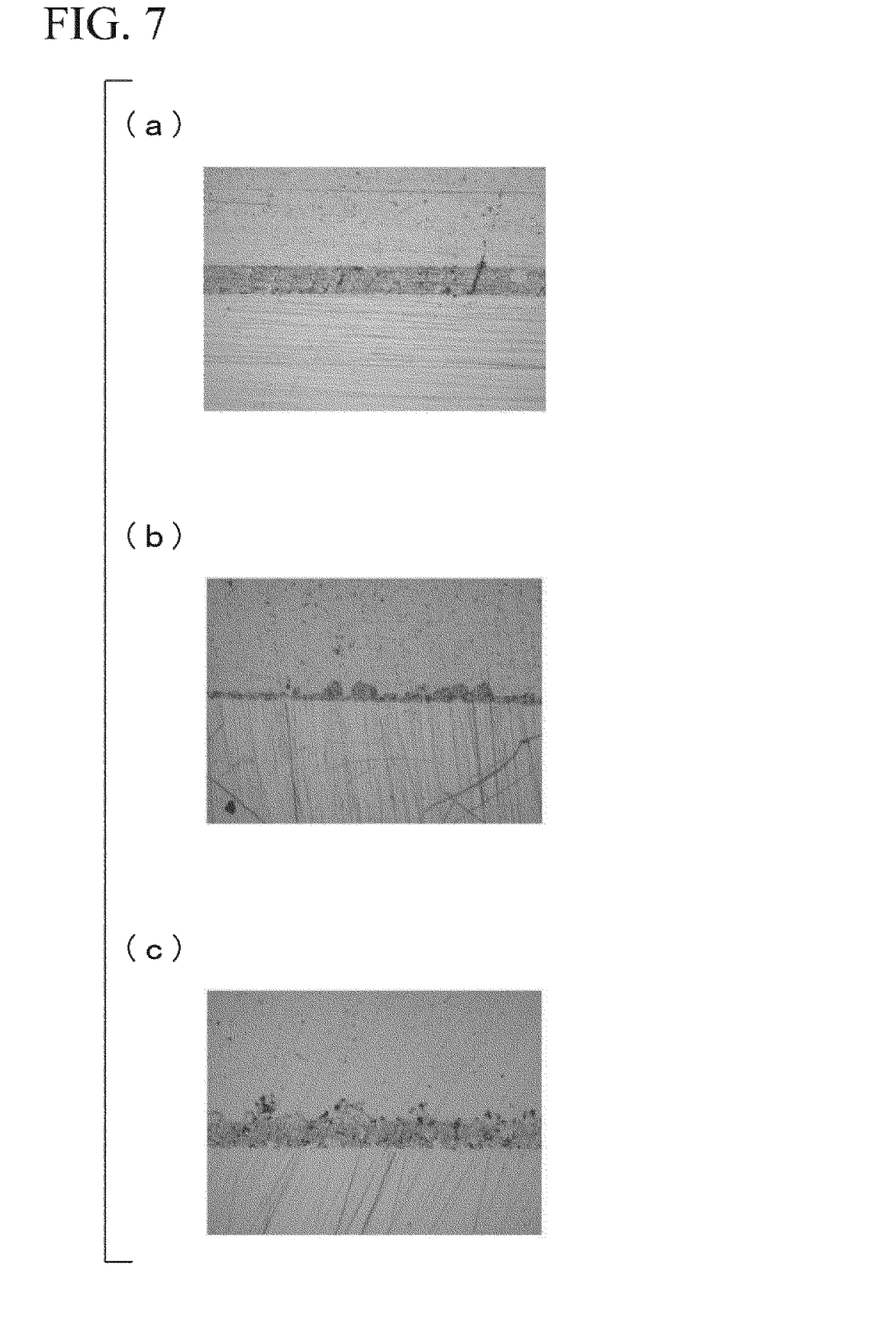
FIGS. 7(a) to 7(c) are photographs of a junction portion of an n-type semiconductor in the thermoelectric conversion elements of Examples 3 and Comparative Examples 3 and 4 of the present invention.

FIGS. 7(a) to 7(c) are photographs of the junction portion of the n-type semiconductors in the thermoelectric conversion elements of Examples 3 and Comparative Examples 3 and 4 of the present invention, respectively. When the heating time was 20 minutes, many small voids were generated, but when the heating time was 5 minutes and 10 minutes, such voids were not generated. Further, when the heating time was 20 minutes and 10 minutes, the junction interface between the n-type semiconductor and the electrode had an uneven structure. However, when the heating time was 5 minutes, the junction interface was flat.

Example 4, Comparative Example 5

When the heating temperature in the heating process was 573° C. and the temperature drop rate after heating in the heating process was 5° C./min and 1° C./min, thermoelectric conversion elements were manufactured as Example 4 and Comparative Example 5, respectively. The conditions other than the heating temperature and the temperature drop rate were the same as in Example 1.

Figure 8:
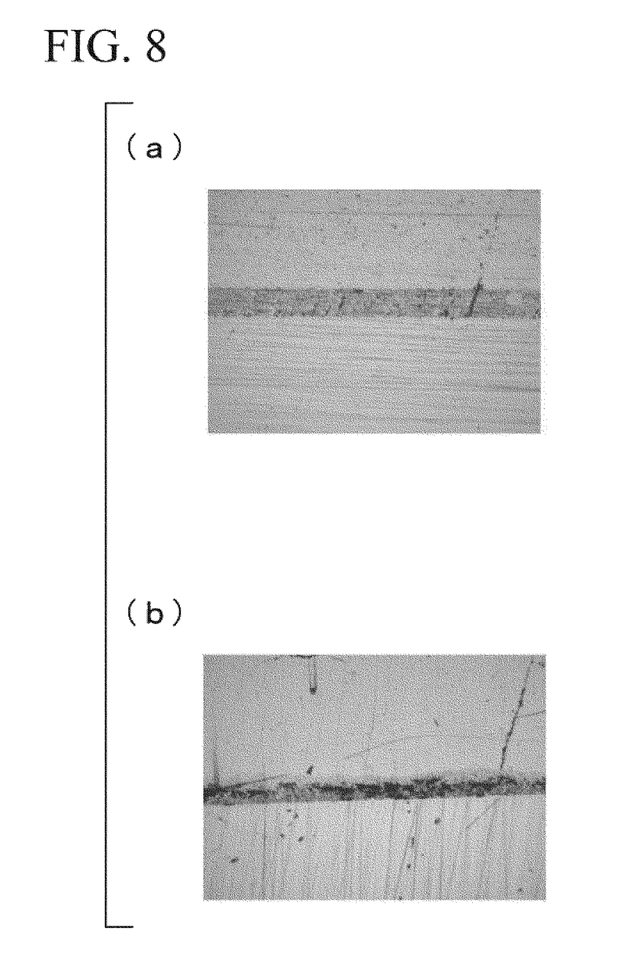
FIGS. 8(a) and 8(b) are photographs of a junction portion of an n-type semiconductor in the thermoelectric conversion element of Example 4 and Comparative Example 5 of the present invention.

FIGS. 8(a) and 8(b) are photographs of the junction portion of the n-type semiconductors in the thermoelectric conversion elements of Example 4 and Comparative Example 5 of the present invention, respectively. When the temperature drop rate was 1° C./min, the Al wax after junction had melted out, the thickness of the alloy layer was not uniform, and voids occupied 40% of the alloy layer. In contrast, when the temperature drop rate was 5° C./min, the alloy layer was normally formed, and a good junction was obtained.

Examples 5 and 6, Comparative Example 6

In the heating process, thermoelectric conversion elements were manufactured as Example 5 and Comparative Example 6 when the heating temperatures were 561° C., 567° C., and 573° C., respectively. The conditions other than the heating temperature were the same as in Example 1.

Figure 9:
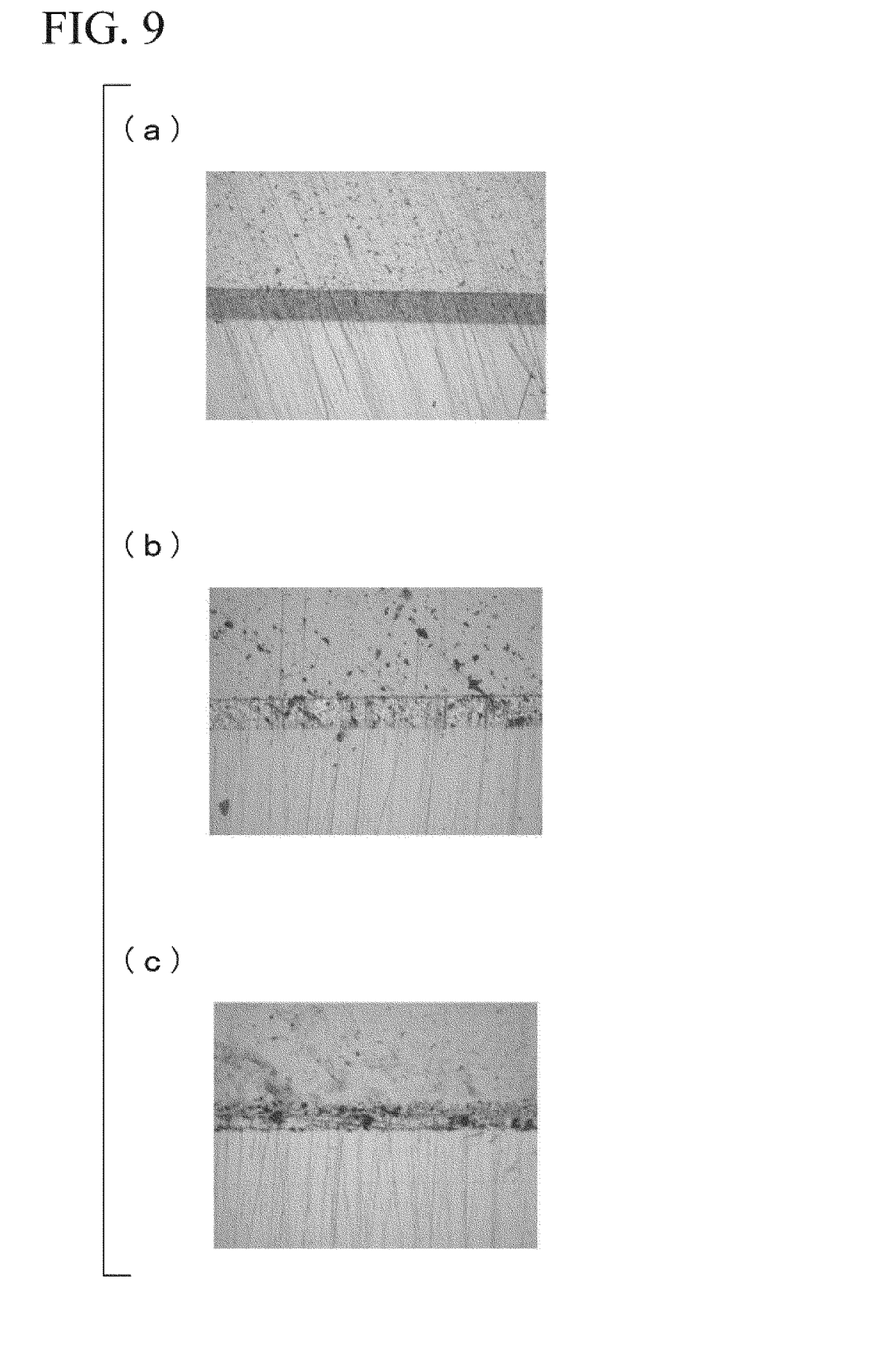
FIGS. 9(a) to 9(c) are photographs of a junction portion of a p-type semiconductor in the thermoelectric conversion elements of Examples 5 and 6 and Comparative Example 6 of the present invention.

FIGS. 9(a) and 9(b) are photographs of the junction portion of the p-type semiconductor in the thermoelectric conversion elements of Examples 5 and 6 and Comparative Example 6 of the present invention, respectively. When the heating temperature was 573° C., cracks and voids were generated, and there was a state which was not suitable for the thermoelectric conversion element. However, when the heating temperature was 561° C. and 567° C., a good junction interface was obtained.

REFERENCE SIGNS LIST

100 Thermoelectric conversion element
101 n-type semiconductor

101a First surface of n-type semiconductor
101b Second surface of n-type semiconductor
102 n-side junction layer
102A First n-side junction layer
102B Second n-side junction layer
103 p-type semiconductor
104 p-side junction layer
105 First electrode
105a One side of first electrode
105b The other side of first electrode
106 Second electrode
107 Alloy layer
107A First layer of alloy layer
107B Second layer of alloy layer
108 Segregation part of Sn
109 Alloy layer
109A First layer of alloy layer
109B Second layer of alloy layer
109C Third layer of alloy layer
110 Thermoelectric conversion device
L Stacking direction

What is claimed is:

1. A thermoelectric conversion element, comprising:
an n-type semiconductor;
a p-type semiconductor;
an n-side junction layer formed on each of a first surface and a second surface of the n-type semiconductor;
a p-side junction layer formed on each of a first surface and a second surface of the p-type semiconductor;
a first electrode which has one side joined to the first surface of the n-type semiconductor via the n-side junction layer, and the other side joined to the first surface of the p-type semiconductor via the p-side junction layer; and
a second electrode which is joined to each of the second surface of the n-type semiconductor and the second surface of the p-type semiconductor via the n-side junction layer and the p-side junction layer,
wherein the n-type semiconductor has a composition represented by the following formula (1),
the p-type semiconductor has a composition represented by the following formula (2), and
the n-side junction layer and the p-side junction layer include Al:

$$Mg_2Si_aSn_{1-a}+A \quad (1)$$

(provided that $0.25 \leq a < 0.75$, and A includes at least one of Sb, Bi, and Fe)

$$Mg_mSi_xSn_yGe_z+B \quad (2)$$

(provided that $1.98 \leq m \leq 2.01$, $0 < x \leq 0.25$, $0.60 \leq y \leq 0.95$, $z \geq 0$, $x+y+z=1$, and $-1.00x+0.40 \geq z \geq -2.00x+0.10$ ($0.00 < x \leq 0.25$), $-1.00y+1.00 \geq z \geq -1.00y+0.75$ ($0.60 \leq y \leq 0.90$), $-2.00y+1.90 \geq z \geq -1.00y+0.75$ ($0.90 < y \leq 0.95$), and B includes at least one of Group 1A alkali metals, Au, Ag, Cu, Zn, Ca, and Ga), and wherein
the first electrode and the second electrode include Ni as a main component,
the n-side junction layer has an AlNi layer and an $Al_3Ni_2$ layer in this order from the first electrode side or the second electrode side, and
the p-side junction layer has a $Ni_3Sn_2$ layer, an AlNi layer, and an $Al_3Ni_2$ layer in this order from the first electrode side or the second electrode side.

2. The thermoelectric conversion element according to claim 1,
wherein Sn is included in at least one of the n-side junction layer and the p-side junction layer.

3. The thermoelectric conversion element according to claim 1,
wherein the p-side junction layer has a first p-side alloy layer including at least one of a constituent material of the first electrode and Al on the first electrode side, and has a second p-side alloy layer including at least one of a constituent material of the second electrode and Al on the second electrode side.

4. The thermoelectric conversion element according to claim 1,
wherein the n-side junction layer has a first n-side alloy layer including at least one of the constituent material of the first electrode and Al on the first electrode side, and has a second n-side alloy layer including at least one of the constituent material of the second electrode and Al on the second electrode side.

5. The thermoelectric conversion element according to claim 1,
wherein a content ratio of Si in the n-side junction layer and the p-side junction layer is 2 wt % or more and 15 wt % or less.

6. A thermoelectric conversion device in which a plurality of thermoelectric conversion elements according to claim 1 are connected,
wherein the two adjacent thermoelectric conversion elements share the second electrode, and
among the two adjacent thermoelectric conversion elements, the n-side junction layer constituting one thermoelectric conversion element and the p-side junction layer constituting the other thermoelectric conversion element are connected with the shared second electrode interposed therebetween.

7. A method for manufacturing the thermoelectric conversion element according to claim 1, the method comprising:
a stacked body-forming process of forming a stacked body;
a pressing process of pressing the stacked body from both sides in a stacking direction; and
a heating process of heating the pressed stacked body,
wherein the stacked body is formed by disposing a first n-side junction layer and a second n-side junction layer on each of the first surface and the second surface of the n-type semiconductor, by disposing a first p-side junction layer and a second p-side junction layer on each of the first surface and the second surface of the p-type semiconductor, by disposing a first electrode on the first n-side junction layer and the first p-side junction layer to straddle both the junction layers, and by disposing one and the other of the two second electrodes on each of the second n-side junction layer and the second p-side junction layer, and
wherein in the heating process, a heating temperature is set to 550° C. or more and 640° C. or less, and a heating time is set to 1 minute or more and 60 minutes or less.

8. The method for manufacturing the thermoelectric conversion element according to claim 7,
wherein a temperature drop rate of the stacked body after the heating process is set to 2° C./min or more and 500° C./min or less.

9. The method for manufacturing the thermoelectric conversion element according to claim 7,
wherein a temperature rise rate of the stacked body before the heating process is set to 5° C./min or more and 200° C./min or less.

10. The method for manufacturing the thermoelectric conversion element according to claim 7,
   wherein a pressure applied to the stacked body in the pressing process is set to 0.01 kg/cm$^2$ or more and 816 kg/cm$^2$ or less.

\* \* \* \* \*